US012763772B2

(12) United States Patent
Sayed et al.

(10) Patent No.: US 12,763,772 B2
(45) Date of Patent: Oct. 13, 2026

(54) HIGH VOLTAGE TO LOW VOLTAGE LEVEL SHIFTER UTILIZING THIN-OXIDE DEVICES

(71) Applicant: QUALCOMM Incorporated, San Diego, CA (US)

(72) Inventors: Mohammad Wasim Sayed, Bangalore (IN); Pradeep Kumar Sana, Bangalore (IN); Rakesh Kumar Sinha, Bangalore (IN)

(73) Assignee: QUALCOMM Incorproated, San Diego, CA (US)

( * ) Notice: Subject to any disclaimer, the term of this patent is extended or adjusted under 35 U.S.C. 154(b) by 162 days.

(21) Appl. No.: 18/583,304

(22) Filed: Feb. 21, 2024

(65) Prior Publication Data

US 2025/0266834 A1 Aug. 21, 2025

(51) Int. Cl.
*H03K 19/0185* (2006.01)

(52) U.S. Cl.
CPC ............................ *H03K 19/018507* (2013.01)

(58) Field of Classification Search
CPC ................................................ H03K 19/18507
See application file for complete search history.

(56) References Cited

U.S. PATENT DOCUMENTS

| | | | | |
|---|---|---|---|---|
| 7,151,400 | B2 * | 12/2006 | Chen | H03K 3/356113 327/333 |
| 7,468,615 | B1 * | 12/2008 | Tan | H03K 19/018528 327/333 |
| 7,791,397 | B2 * | 9/2010 | Chen | H03K 3/356113 327/333 |
| 9,893,726 | B1 * | 2/2018 | Katakwar | H03K 19/0013 |
| 10,418,998 | B1 * | 9/2019 | Cheng | H03K 19/018521 |
| 10,911,047 | B1 * | 2/2021 | Shetty | H03K 3/356182 |
| 2009/0033401 | A1 * | 2/2009 | Kossel | H03K 3/35613 327/333 |
| 2009/0058491 | A1 * | 3/2009 | Kang | H03K 19/018521 327/333 |
| 2013/0257505 | A1 * | 10/2013 | Chiang | H03K 19/0185 327/333 |
| 2016/0056822 | A1 * | 2/2016 | Fifield | H03K 19/0944 327/333 |
| 2016/0241243 | A1 * | 8/2016 | Potluri | H03K 3/356069 |
| 2019/0025862 | A1 * | 1/2019 | Singh | G06F 1/305 |
| 2023/0308101 | A1 * | 9/2023 | Sung | H03K 19/017 |

* cited by examiner

*Primary Examiner* — Thomas J. Hiltunen
*Assistant Examiner* — Khareem E Almo
(74) *Attorney, Agent, or Firm* — Loza & Loza, LLP

(57) ABSTRACT

An apparatus, including: an input node to receive a signal at a pre-defined voltage; an output node; and a plurality of thin-oxide Metal Oxide-Semiconductor Field Effect Transistors (MOSFETs) coupled to the input node and to the output node, the plurality of thin-oxide MOSFETs configured to form a regenerative feedback loop to reduce the signal at the pre-defined voltage to a lower level voltage, wherein the signal at the lower level voltage is outputted through the output node.

19 Claims, 6 Drawing Sheets

HIGH VOLTAGE TO LOW VOLTAGE LEVEL SHIFTER UTILIZING THIN-OXIDE DEVICES

FIELD

Aspects of the present disclosure relate generally to data processing circuits, and, in particular, to a high voltage to low voltage level shifter utilizing thin-oxide devices.

BACKGROUND

Functional circuits, such as processors, memory, and others, have logic components that need to communicate with one another but that may operate at different voltage levels. Level shifters are a type of circuit that translates logical signals at one voltage level to logical signals of another voltage level. There are many examples of types of applications that require the use of multiple voltage levels. In such applications, level shifters may be used to communicate between different sections of functional circuits (e.g., integrated circuits (ICs)) having different power supply voltages.

Currently, circuit nodes (e.g., less than 5 nm) are being implemented that can operate with thick-oxide devices and can be accommodated by level shifters utilizing thick-oxide devices. However, circuit nodes are now accommodating low-oxide devices and level shifters utilizing low-oxide devices are needed.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. An apparatus, including: an input node to receive a signal at a pre-defined voltage; an output node; and a plurality of thin-oxide Metal Oxide-Semiconductor Field Effect Transistors (MOSFETs) coupled to the input node and to the output node, the plurality of thin-oxide MOSFETs configured to form a regenerative feedback loop to reduce the signal at the pre-defined voltage to a lower level voltage, wherein the signal at the lower level voltage is outputted through the output node.

Another aspect of the disclosure relates to a method. The method includes: receiving a signal at a pre-defined voltage at an input node; and operating a plurality of thin-oxide Metal Oxide-Semiconductor Field Effect Transistors (MOSFETs) coupled to the input node and to an output node to create a lower level voltage signal outputted through the output node, wherein, the plurality of thin-oxide MOSFETs are configured to form a regenerative feedback loop to reduce the signal at the pre-defined voltage to a lower level voltage, wherein the signal at the lower level voltage is outputted through the output node.

Another aspect of the disclosure relates to an apparatus. The apparatus including: means for receiving a signal at a pre-defined voltage at an input node; and means for configuring a plurality of thin-oxide Metal Oxide-Semiconductor Field Effect Transistors (MOSFETs) coupled to the input node and an output node to form a regenerative feedback loop to reduce the signal at the pre-defined voltage to a lower level voltage, wherein the signal at the lower level voltage is outputted through the output node.

Another aspect of the disclosure relates to a wireless communication device. The wireless communication device comprises: at least one antenna; a transceiver coupled to the at least one antenna; and one or more signal processing cores coupled to the transceiver, wherein the one or more signal processing cores comprise: an input node to receive a signal at a pre-defined voltage; an output node; and a plurality of thin-oxide Metal Oxide-Semiconductor Field Effect Transistors (MOSFETs) coupled to the input node and to the output node, the plurality of thin-oxide MOSFETs configured to form a regenerative feedback loop to reduce the signal at the pre-defined voltage to a lower level voltage, wherein the signal at the lower level voltage is outputted through the output node.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
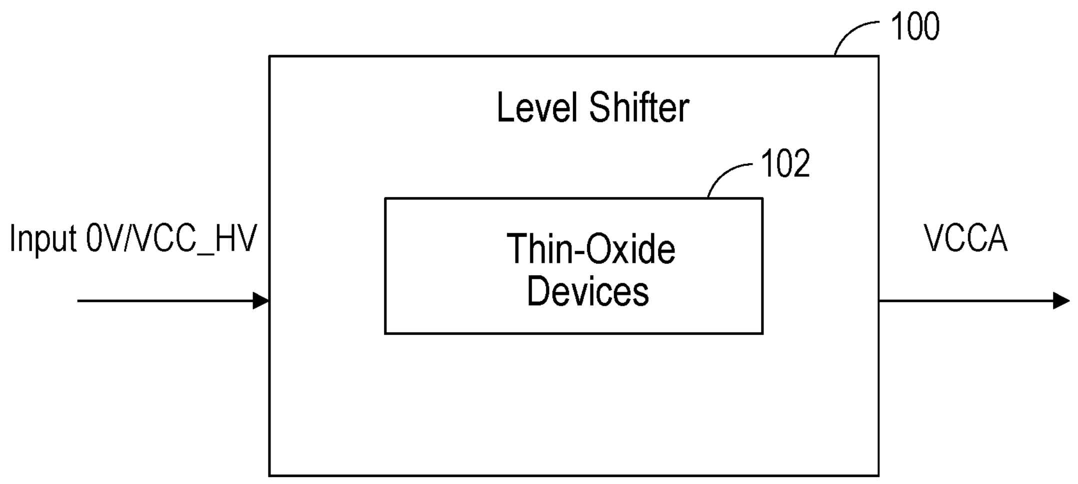
FIG. 1 illustrates a block diagram of an example level shifter circuit in accordance with an aspect of the disclosure.

FIG. 1 illustrates a block diagram of an example level shifter circuit 100 in accordance with an aspect of the disclosure. As will be described, example level shifter circuit 100 includes a regenerative loop formed by a plurality of thin-oxide devices 102 to operate as a high voltage input (e.g., input VCC_HV) to low voltage output (e.g., VCCA) level shifter. Therefore, the example level shifter circuit 100 can receive a signal at pre-defined voltage (e.g., a high voltage input (e.g., input VCC_HV)) at an input node and reduce the signal to a lower voltage level (e.g., VCCA) that is outputted at an output node.

Figure 2:
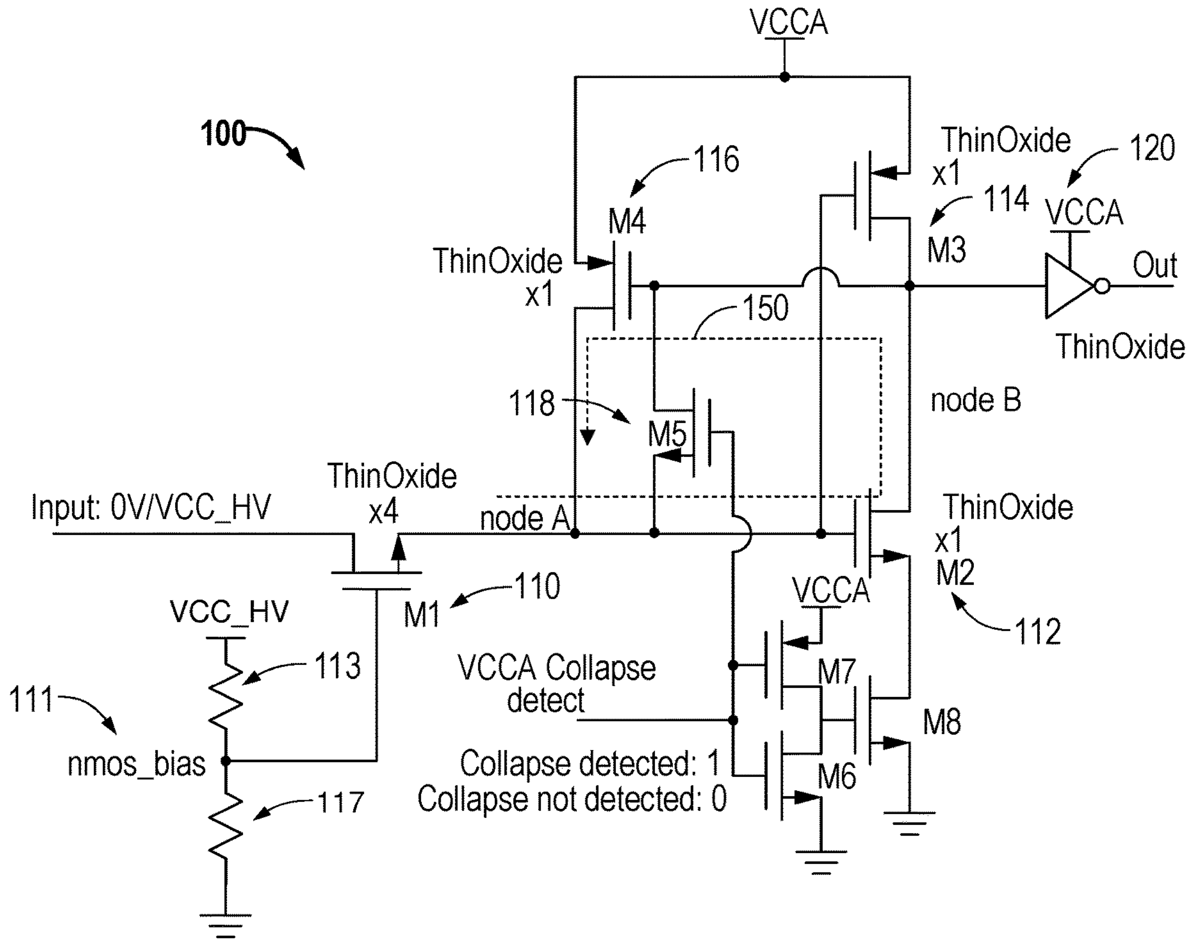
FIG. 2 illustrates a block diagram of an example level shifter circuit in accordance with an aspect of the disclosure.

FIG. 2 illustrates a block diagram of an example level shifter circuit 100 in accordance with an aspect of the disclosure. In this example, example level shifter circuit 100 includes multiple thin-oxide Metal Oxide-Semiconductor Field Effect Transistors (MOSFETs) (e.g., M1, M2, M3, M4, M5, M6, M7, M8), some of which are used, to form a regenerative loop, as will be described. The example level shifter circuit 100 may be implemented in an integrated circuit (IC), such as a system on chip (SOC). It shall be understood that the example level shifter circuit 100 is merely an example, and many variations with the same and/or different components are contemplated.

In particular, example level shifter circuit 100 includes multiple thin-oxide MOSFETs (M1 110, M2 112, M3 114, M4 116, and M5 118) that aid in creating a regenerative loop, as will be described. As will be described, some of the plurality of thin-oxide MOSFETs are configured to form a regenerative feedback loop to reduce a signal received at a pre-defined voltage level (e.g., a high or maximum voltage input level) at an input node to a lower level voltage such that the signal at the lower level voltage is outputted through an output node (e.g., a voltage output inverter).

The structure and operation of example level shifter circuit 100 will now be described. The signal at input node 0V/VCC_HV is coupled to M1 110. Input 0V/VCC_HV is coupled to the drain of M1 110. The source of M1 110 is coupled to node A and M2 112, M4 116, and M5 118, as will be described. The gate of M1 is coupled to a nmos_bias portion 111. The nmos_bias portion 111 includes VCC_HV, a first resistor 113, a second resistor 117, and ground. In one example, the pre-defined voltage may be defined as a maximum or high voltage (VCC_HV). Hereafter, the pre-defined voltage will be referred to as VCC_HV.

In operation, as part of a functional mode, assuming the signal input begins at an input of 0 Volt (e.g., logic 0), at this point, M1 110 is passed due to the nmos_bias portion 111 set to VCC_HV, which is always on, and connected to gate of M1 110. Because of this the voltage passes through node A and node B to VCCA output inverter 120 of the output node and the output signal is 0 Volts.

On the other hand, assuming the input becomes logic 1 (e.g., VCC_HV maximum, 1.2 V), at the input node, node A follows the input. However, the nmos_bias portion 111, does not let M1 110 pass the complete voltage immediately. As the gate of M1 110 is nmos_bias and Vthn is the threshold voltage of M1 110, node A can charge up to nmos_bias-Vthn. This provides safe reliability for all of the transistors in the voltage level shifter 100.

As node A charges up, the rest of the example level shifter circuit 100 is affected.

Looking at the rest of the example level shifter 100, VCCA is coupled to M3 114. In particular, VCCA is coupled to the source of M3 114. The gate of M3 114 is coupled to node A and the gate of M2 112. The drain of M3 114 is coupled to node B, VCCA output inverter 120, and the drain of M2 112. Further, VCCA is coupled to M4 116. In particular, VCCA is coupled to the source of M4 114. The drain of M4 114 is coupled to node A. The gate of M4 116 is coupled to node B and VCCA output inverter 120. Further, the gate of M4 116 is coupled to the drain of M5 118.

The gate of M5 118 is coupled to the gate of M7 of the VCCA Collapse Detect portion of the example level shifter 100, that will be described in more detail hereafter. The source of M5 is coupled to node A and the gate of M2 112. The drain of M2 112 is coupled to node B and the drain of M3 114. Further, the source of M2 112 is coupled to the drain of M8 of the of the VCCA Collapse Detect portion, that will be described in more detail hereafter.

Continuing with the example that the voltage level for signal becomes logic 1 (e.g., VCC_HV maximum, 1.2 V), node A follows the input and as node A charges up, the rest of the example level shifter circuit 100 is affected. During this time, M2 112 becomes partial on with current flowing drain to source and M3 114 becomes partial off, which causes M4 116 to become partial on with current flowing from source to drain such that the drain of M4 118 charges up node A. In this way, a feedback loop 150 is created and this feedback loop 150 keeps working until node A becomes VCCA and node B becomes zero. During this operation M5 118 is off and M4 116 is on. M3 114, M2 112, and M4 116 create the feedback loop 150 to node A, which holds the input logic, to turn on and off VCCA output inverter 120 for VCCA output.

Therefore, the voltage level shifter 100 utilizing this feedback loop 150 converts logic 1 signal/high voltage (e.g., VCC_HV maximum, 1.2 V) from the input node to a low voltage output VCCA (e.g., approximately 0.7 V) signal in a reliable manner that is outputted via VCCA output inverter 120 at the output node. In one embodiment, the output node includes the VCCA output inverter.

When input signal becomes logic 0 (from VCC_HV), node A follows the input node. The gate of M1 110 is nmos_bias. There is an initial push-pull current on node A due to M4 116 and M1 110 working together. As the size of M1 110 may be approximately four times larger than M4 116, after an amount of time M1 110 pulls more current from node A compared to M4 116's current push, and node A goes back to approximately 0 volts. Again, the M2, M3, M4 112, 114, and 116 feedback loop works in a regenerative fashion such that node A goes back to 0 V and the output signal goes back to 0 V via VCCA output inverter 120.

It should be appreciated that the previously described example level shifter circuit 100 utilizes only thin-oxide devices. Also, the VCC_HV supply used to generate the nmos_bias provides a safeguard to the reliability limits of thin-oxide devices.

Figure 3:
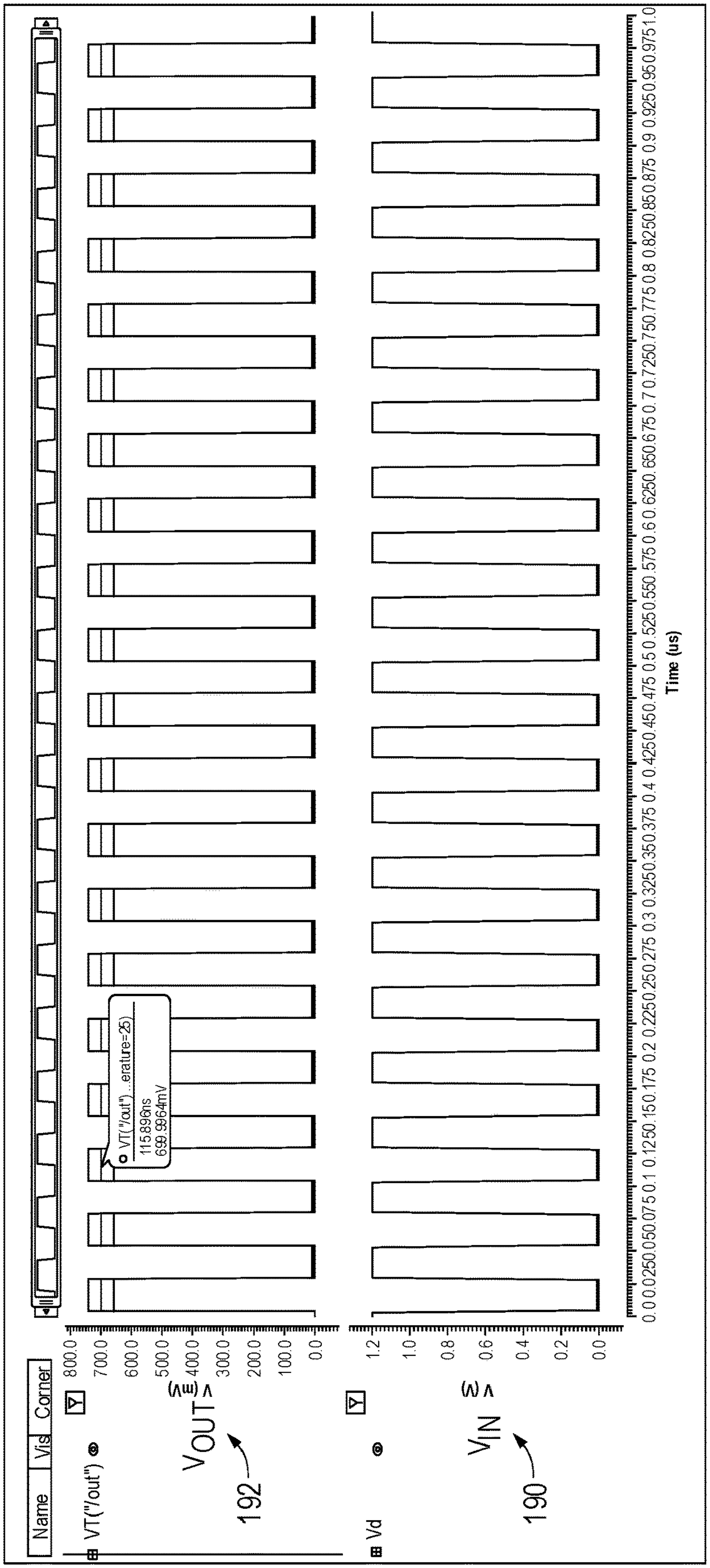
FIG. 3 illustrates a graph diagram of an example of the input voltage and output voltage of the example level shifter circuit in accordance with an aspect of the disclosure.

FIG. 3 illustrates a graph diagram of an example of the input voltage and output voltage of the example level shifter circuit 100 in accordance with an aspect of the disclosure. In this example, as can be seen in FIG. 3, the voltage input (VIN) graph 190 shows the input of signals inputted into example level shifter 100 at the input node cycling between 0V/VCC_HV (e.g., 0V and 1.2 V) and the voltage output (VOUT) graph 192 coming from VCCA output inverter 120 at the output node with signals cycling between 0V and approximately 0.7 V, illustrating the performance of example level shifter circuit 100.

Figure 4:
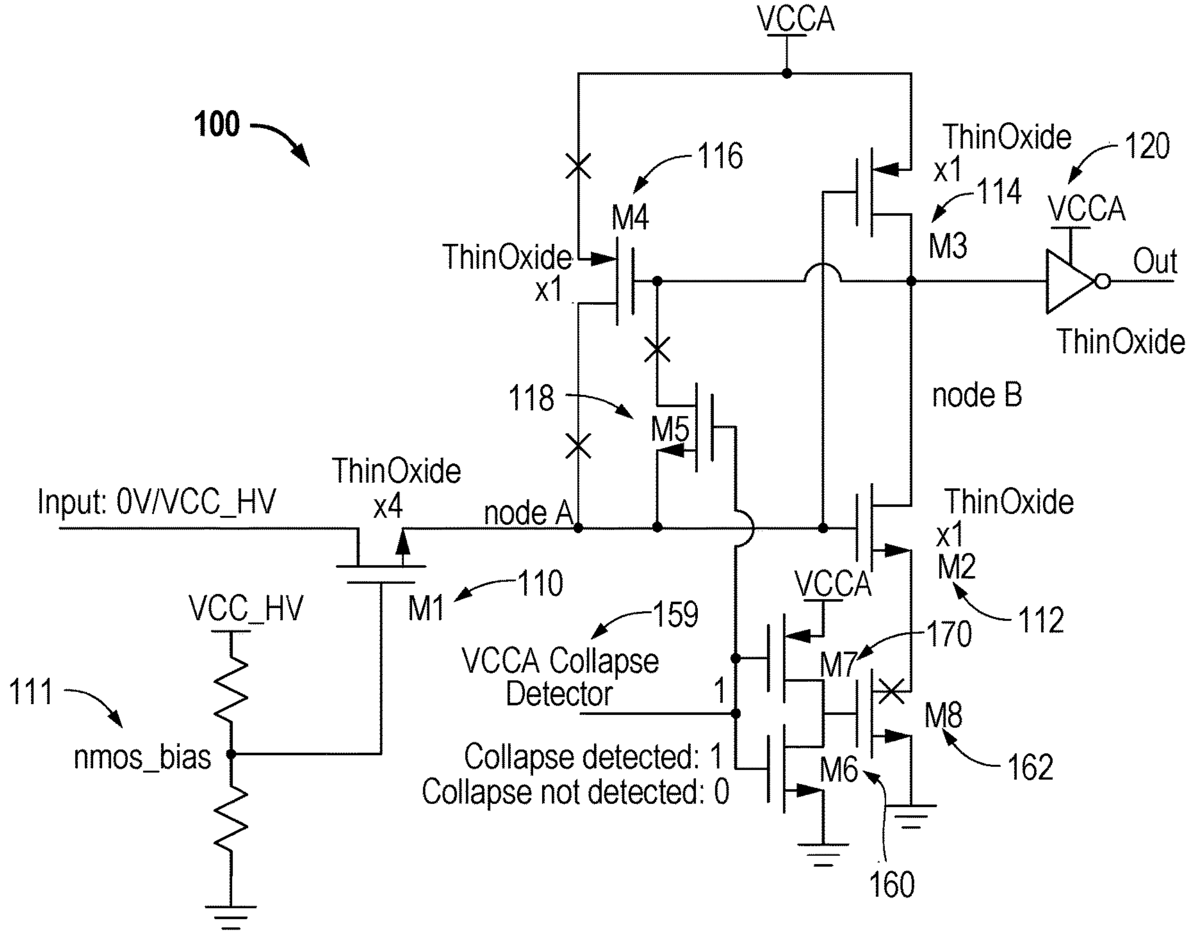
FIG. 4 illustrates a block diagram of an example level shifter circuit that includes VCCA collapse detector in accordance with an aspect of the disclosure.

FIG. 4 illustrates a block diagram of an example level shifter circuit 100 that includes a VCCA collapse detector in accordance with an aspect of the disclosure. FIG. 4 is similar to FIG. 3 including the same structures and operations of example level shifter circuit 100, as described with reference to FIG. 3. For example, input 0V/VCC_HV is coupled to M1 110. Input 0V/VCC_HV is coupled to the drain of M1 110. The source of M1 110 is coupled to node A and M2 112, M4 116, and M5 118. The gate of M1 is coupled to a nmos_bias portion 111. When, the input becomes logic 1 (e.g., VCC_HV maximum, 1.2 V), node A follows the input. As node A charges up, the rest of the example level shifter circuit 100 is affected. Looking at the rest of the example level shifter 100, VCCA is coupled to M3 114. In particular, VCCA is coupled to the source of M3 114. The gate of M3 114 is coupled to node A and the gate of M2 112. The drain of M3 114 is coupled to node B, VCCA output inverter 120, and the drain of M2 112. Further, VCCA is coupled to M4 116. In particular, VCCA is coupled to the source of M4 114. The drain of M4 114 is coupled to node A. The gate of M4 116 is coupled to node B and VCCA output inverter 120. Further, the gate of M4 116 is coupled to the drain of M5 118. The gate of M5 118 is coupled to the gate of M7 of the VCCA Collapse Detect portion of the example level shifter 100, that will be hereafter discussed. The source of M5 is coupled to node A and the gate of M2 112. The drain of M2 112 is coupled to node B and the drain of M3 114. Further, the source of M2 112 is coupled to the drain of M8 of the VCCA Collapse Detect portion, that will be hereafter discussed. Continuing with the example that the signal becomes logic 1 (e.g., VCC_HV maximum, 1.2 V) at the input node, node A follows the input and as node A charges up, the rest of the example level shifter circuit 100 is affected. During this time, M2 112 becomes partial on with current flowing drain to source and M3 114 becomes partial off, which causes M4 116 to become partial on with current flowing from source to drain such that the drain of M4 118 charges up node A. In this way, a feedback loop 150 is created and this feedback loop 150 keeps working until node A becomes VCCA and node B becomes zero. During this operation M5 118 is off and M4 116 is on. M3 114, M2 112, and M4 116 create the feedback loop 150 to node A, which holds the input logic, to turn on and off VCCA output inverter 120 for signal output at the VCCA output inverter 120 at the output node.

As particularly described in FIG. 4, a VCCA collapse detector 159 may be utilized. The VCCA collapse detector 159 receives a VCCA collapse detection (e.g., 1) from an external collapse detector. This collapse detection is inputted to components the of the VCCA collapse detector 159. In particular, VCCA collapse detection set to 1 is sent to the gate of M7 170 that has a source set to VCCA and a drain that is attached to the gate of M8 162 and the VCCA collapse detection set to 1 is sent to the gate of M6 162 that has a source set to ground and a drain that is attached to the gate of M8 162. Further, the gate of M7 170 is attached to the gate of M5 118.

Based upon this configuration of the VCCA collapse detector 159, if a VCCA collapse is detected (e.g., Collapse Detected: 1, based on a collapse detect signal), then M5 118 is turned on and M8 162 is turned off. In particular, when collapse detected set to 1 is set to the gate of M7 170, VCCA is applied from the drain of M7 170 to the gate of M8 162 as well as ground from the drain of M6 180 such that M8 162 is turned off. Additionally, the gates of M5 118 and M4 116 are set to ground through M6 160 source to ground.

Based upon this, with M5 180 being turned on and M8 being turned off during the VCCA collapse condition, based on the collapse detect signal (e.g., set to logic 1), any static leakage path from voltage input from node A to VCCA is completely disabled.

Accordingly, as can be seen in FIG. 4, any static leakage path from the input of node A to VCCA of the output node is cut-off (e.g., X-marked in FIG. 4).

When a collapse is not detected (e.g., Collapse Detected: 0), example level shifter circuit 100 operates as previously described.

Also, during a VCC_HV voltage input that collapses, while VCCA is available, nmos_bias becomes 0 V, which turns off the M1 110 and prevents any static leakage path from VCCA to input node.

It should be appreciated that the previously described example level shifter circuit 100 utilizes only thin-oxide devices to convert higher voltage levels (VCC_HV, e.g., 1.2 V) to lower voltage levels (VCCA, e.g., approximately 0.7 V). During the functioning, non-functioning, and power collapse modes, all of the components of the example level shifter 100 operate in a safe reliability limit. During functional or power collapse states, there is zero static current. Also, the VCC_HV supply used to generate the nmos_bias provides a safeguard to the reliability limits of thin-oxide devices.

Figure 5:
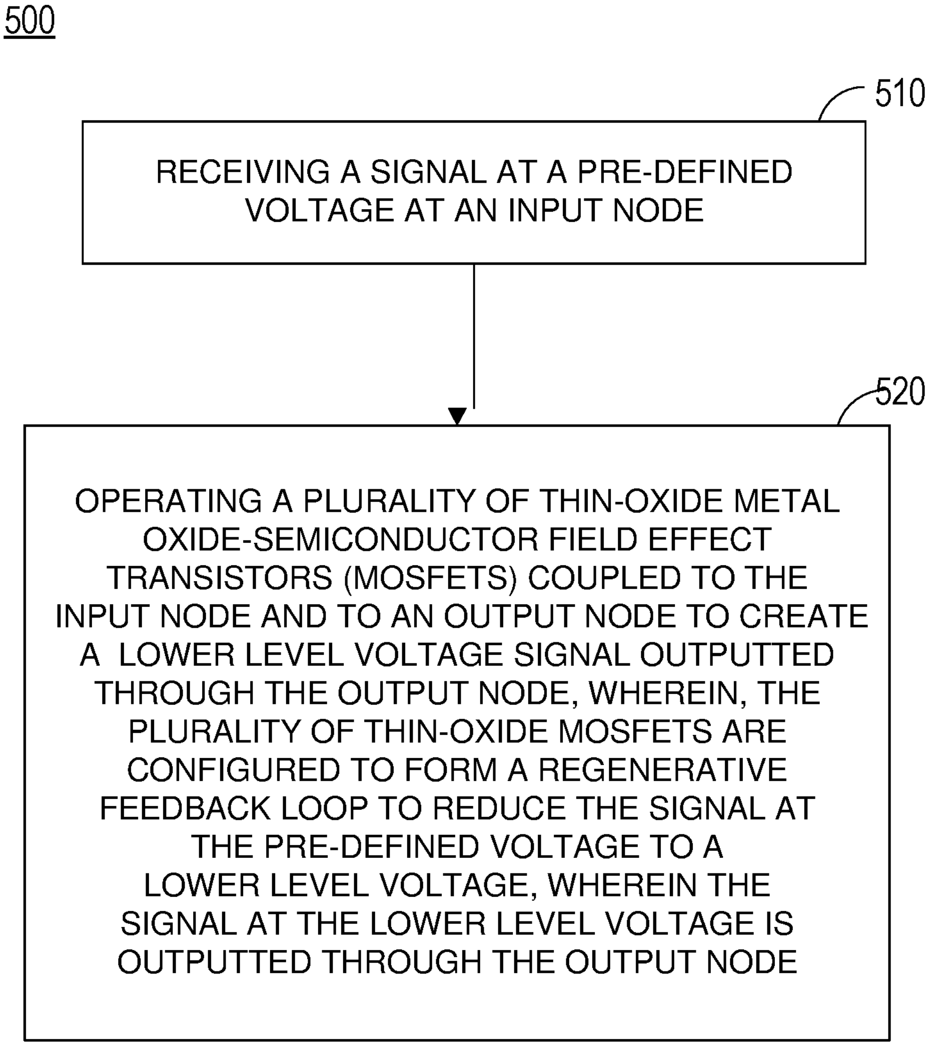
FIG. 5 illustrates a flow diagram of an example method of a regenerative feedback loop to reduce the received pre-defined voltage input to the lower level voltage in accordance with another aspect of the disclosure

FIG. 5 illustrates a flow diagram of an example method 500 of a regenerative feedback loop to reduce the received pre-defined voltage input level to the lower level voltage in accordance with another aspect of the disclosure. The method 500 includes receiving a signal at a pre-defined voltage at an input node (block 510). Further, the method 500 includes operating a plurality of thin-oxide Metal Oxide-Semiconductor Field Effect Transistors (MOSFETs) coupled to the input node and to an output node to create a lower level voltage signal outputted through the output node, wherein, the plurality of thin-oxide MOSFETs are configured to form a regenerative feedback loop to reduce the signal at the pre-defined voltage to a lower level voltage, wherein the signal at the lower level voltage is outputted through the output node (block 520).

Figure 6:
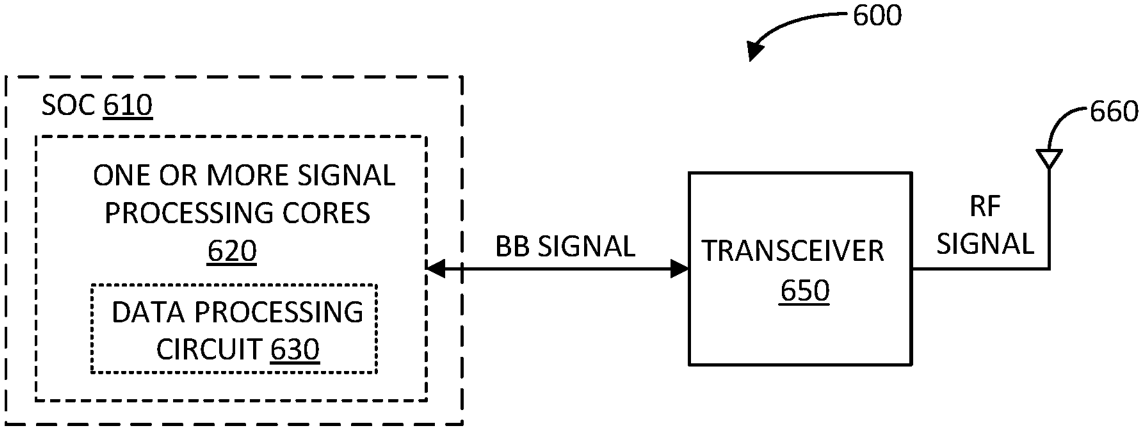
FIG. 6 illustrates a block diagram of an example wireless communication device in accordance with another aspect of the disclosure.

FIG. 6 illustrates a block diagram of an example wireless communication device 600 in accordance with another aspect of the disclosure. The wireless communication device 600 may be a smart phone, a desktop computer, laptop computer, tablet device, Internet of Things (IoT), wearable wireless device (e.g., wireless watch), and other types of wireless device.

In particular, the wireless communication device 600 includes an integrated circuit (IC), which may be implemented as a system on chip (SOC) 610. The SOC 610 includes one or more signal processing cores 620 including a data processing circuit 630. The one or more signal processing cores 620 may be configured to generate a transmit baseband (BB) signal and process a received baseband (BB) signal using the data processing circuit 630. The data processing circuit 630 or any of the other circuits may include the example level shifter circuit 100, previously described.

The wireless communication device 600 may further include a transceiver 650 and at least one antenna 660 (e.g., an antenna array). The transceiver 650 is coupled to the one or more signal processing cores 620 to receive therefrom the transmit BB signal and provide thereto the received BB signal. The transceiver 650 is configured to convert the transmit BB signal into a transmit radio frequency (RF) signal, and convert a received RF signal into the received BB signal. The transceiver 650 is coupled to the at least one antenna 660 to provide thereto the transmit RF signal for electromagnetic radiation into a wireless medium for wireless transmission, and receive the received RF signal electromagnetically picked up from the wireless medium by the at least one antenna 660.

The following provides an overview of aspects of the present disclosure:

Aspect 1: An apparatus, comprising: an input node to receive a signal at a pre-defined voltage; an output node; and a plurality of thin-oxide Metal Oxide-Semiconductor Field Effect Transistors (MOSFETs) coupled to the input node and to the output node, the plurality of thin-oxide MOSFETs configured to form a regenerative feedback loop to reduce the signal at the pre-defined voltage to a lower level voltage, wherein the signal at the lower level voltage is outputted through the output node.

Aspect 2: The apparatus of aspect 1, wherein the plurality of thin-oxide MOSFETs (Ms) to create the regenerative feedback loop comprises a thin-oxide M that turns partially on coupled to another thin-oxide M that turns partially off that causes another thin-oxide M to charge a node to turn on the output node to output the signal at the lower level voltage.

Aspect 3: The apparatus of aspect 2, wherein the output node comprises a voltage output inverter.

Aspect 4: The apparatus of aspect 2, wherein the pre-defined voltage is approximately 1.2 V.

Aspect 5: The apparatus of aspect 2, wherein the lower level voltage is approximately 0.7 V.

Aspect 6: The apparatus of aspect 2, further comprising a pair of thin-oxide Ms, wherein, when the signal at the input node cycles back to 0 Volts, a push-pull current is applied to the node by the pair of thin-oxide Ms, such that the node returns back to 0 Volts and the output node returns to 0 Volts.

Aspect 7: The apparatus of aspect 2, further comprising a first input thin-oxide M coupled to the input node.

Aspect 8: The apparatus of aspect 7, wherein the first input thin-oxide M is further coupled to a nmos_bias portion set to the pre-defined voltage.

Aspect 9: The apparatus of aspect 8, wherein, when the input node receives the signal at 0 V, the first input thin-oxide M is passed through to the output node such that voltage output is 0 V.

Aspect 10: The apparatus of aspect 9, wherein, when the input node receives the signal at the pre-defined voltage, the nmos_bias portion coupled to a gate of the first input thin-oxide M, controls a rate of the charging of the node.

Aspect 11: The apparatus of aspect 10, wherein, when the pre-defined voltage collapses to 0 V, the nmos_bias portion reduces to 0 V, such that the first input thin-oxide M prevents a static leakage path to the input node.

Aspect 12: The apparatus of aspect 1, further comprising an output voltage collapse detector.

Aspect 13: The apparatus of aspect 12, wherein, if the output voltage collapse detector receives a collapse detected signal, a thin-oxide M is turned on such that any static leakage path to the output node is cut-off.

Aspect 14: A method, comprising: receiving a signal at a pre-defined voltage at an input node; and operating a plurality of thin-oxide Metal Oxide-Semiconductor Field Effect Transistors (MOSFETs) coupled to the input node and to an output node to create a lower level voltage signal outputted through the output node, wherein, the plurality of thin-oxide MOSFETs are configured to form a regenerative feedback loop to reduce the signal at the pre-defined voltage to a lower level voltage, wherein the signal at the lower level voltage is outputted through the output node.

Aspect 15: The method of aspect 14, wherein the plurality of thin-oxide MOSFETs (Ms) to create the regenerative feedback loop comprises a thin-oxide M that turns partially on coupled to another thin-oxide M that turns partially off that causes another thin-oxide M to charge a node to turn on the output node to output the signal at the lower level voltage.

Aspect 16: The method of aspect 15, wherein the output node comprises a voltage output inverter.

Aspect 17: The method of aspect 15, wherein the pre-defined voltage is approximately 1.2 V.

Aspect 18: The method of aspect 15, wherein the lower level voltage is approximately 0.7 V.

Aspect 19: The method of aspect 15, further comprising, operating a pair of thin oxide Ms, wherein, when the voltage input cycles back to 0 Volts, a push-pull current is applied to the node by the pair of thin oxide Ms, such that the node returns back to 0 Volts, and the output returns to 0 Volts.

Aspect 20: The method of aspect 15, further comprising operating a first input thin-oxide M coupled to the voltage input, wherein the first input thin-oxide M is further coupled to a nmos_bias portion set to the pre-defined voltage input.

Aspect 21: The method of aspect 20, wherein, when the input node receives the signal at 0 V, the first input thin-oxide M is passed to the output node such that the voltage output is 0 V.

Aspect 22: The method of aspect 21, wherein, when the input node receives the signal at the pre-defined voltage, further comprising operating the first input thin-oxide M to control a rate of the charging of the node based upon the nmos_bias portion being coupled to a gate of the first input thin-oxide M.

Aspect 23: The method of aspect 22, wherein, when the pre-defined voltage collapses to 0 V, further comprising controlling the operation of the first input thin-oxide M such that the nmos_bias portion reduces to 0 V and the first input thin-oxide M prevents a static leakage path to the input.

Aspect 24: The method of aspect 14, further comprising operating an output voltage collapse detector.

Aspect 25: The method of aspect 24, wherein, if the output voltage collapse detector receives a collapse detected signal, performing an operation of turning on a thin-oxide MOSFET (M) to cut-off any static leakage path to the output node.

Aspect 26: An apparatus, comprising: means for receiving a signal at a pre-defined voltage at an input node; and means for configuring a plurality of thin-oxide Metal Oxide-Semiconductor Field Effect Transistors (MOSFETs) coupled to the input node and an output node to form a regenerative feedback loop to reduce the signal at the pre-defined voltage to a lower level voltage, wherein the signal at the lower level voltage is outputted through the output node.

Aspect 27: The apparatus of aspect 26, further comprising means for providing an output voltage collapse detector, wherein, if the output voltage collapse detector receives a collapse detected signal, a thin-oxide MOSFET (M) is turned on such that any static leakage path to the output node is cut-off.

Aspect 28: A wireless communication device, comprising: at least one antenna; a transceiver coupled to the at least one antenna; and one or more signal processing cores coupled to the transceiver, wherein the one or more signal processing cores comprise: an input node to receive a signal at a pre-defined voltage; an output node; and a plurality of thin-oxide Metal Oxide-Semiconductor Field Effect Transistors (MOSFETs) coupled to the input node and to the output node, the plurality of thin-oxide MOSFETs configured to form a regenerative feedback loop to reduce the signal at the pre-defined voltage to a lower level voltage, wherein the signal at the lower level voltage is outputted through the output node.

Aspect 29: The wireless communication device of aspect 28, wherein the plurality of thin-oxide MOSFETs (Ms) to create the regenerative feedback loop comprises a thin-oxide M that turns partially on coupled to another thin-oxide M that turns partially off that causes another thin-oxide M to charge a node to turn on the output node to output the signal at the lower level voltage.

Aspect 30: The wireless communication device of aspect 29, further comprising an output voltage collapse detector, wherein, if the output voltage collapse detector receives a collapse detected signal, a thin-oxide MOSFET (M) is turned on such that any static leakage path to the output node is cut-off.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:

an input node to receive a signal at a pre-defined voltage;

an output node; and a plurality of thin-oxide Metal Oxide-Semiconductor Field Effect Transistors (MOSFETs) coupled to the input node and to the output node, the plurality of thin-oxide MOSFETs configured to form a regenerative feedback loop to reduce the signal at the pre-defined voltage to a lower level voltage, wherein the signal at the lower level voltage is outputted through the output node, wherein the plurality of thin-oxide MOSFEts (Ms) comprises a first input thin-oxide M, and wherein a drain of the first input thin-oxide M is directly coupled to the input node.

2. The apparatus of claim 1, wherein the plurality of thin-oxide Ms to create the regenerative feedback loop comprises a second thin-oxide M that turns partially on coupled to a third thin-oxide M that turns partially off that causes a fourth thin-oxide M to charge a node to turn on the output node to output the signal at the lower level voltage.

3. The apparatus of claim 2, wherein the output node comprises a voltage output inverter.

4. The apparatus of claim 2, wherein the pre-defined voltage is approximately 1.2 V.

5. The apparatus of claim 2, wherein the lower level voltage is approximately 0.7 V.

6. The apparatus of claim 2, wherein, when the signal at the input node cycles back to 0 Volts, a push-pull current is applied to the node by the first thin-oxide M and the fourth thin-oxide M, such that the node returns back to 0 Volts and the output node returns to 0 Volts.

7. The apparatus of claim 1, wherein the first input thin-oxide M is further coupled to a nmos_bias portion set to the pre-defined voltage.

8. The apparatus of claim 7, wherein, when the input node receives the signal at 0 V, the first input thin-oxide M is passed through to the output node such that voltage output is 0 V.

9. The apparatus of claim 8, wherein, when the input node receives the signal at the pre-defined voltage, the nmos_bias portion coupled to a gate of the first input thin-oxide M, controls a rate of the charging of the node.

10. The apparatus of claim 9, wherein, when the pre-defined voltage collapses to 0 V, the nmos_bias portion reduces to 0 V, such that the first input thin-oxide M prevents a static leakage path to the input node.

11. The apparatus of claim 1, further comprising an output voltage collapse detector.

12. The apparatus of claim 11, wherein, if the output voltage collapse detector receives a collapse detected signal, another thin-oxide M of the plurality of thin-oxide Ms is turned on such that any static leakage path to the output node is cut-off.

13. A method, comprising:

receiving a signal at a pre-defined voltage at an input node; and operating a plurality of thin-oxide Metal Oxide-Semiconductor Field Effect Transistors (MOSFETs) coupled to the input node and to an output node to create a lower level voltage signal outputted through the output node, wherein, the plurality of thin-oxide MOSFETs are configured to form a regenerative feedback loop to reduce the signal at the pre-defined voltage to a lower level voltage, wherein the signal at the lower level voltage is outputted through the output node, wherein the plurality of thin-oxide MOSFETs (Ms) comprises a first input thin-oxide M, and wherein a drain of the first input thin-oxide M is directly coupled to the input node.

14. The method of claim 13, wherein the plurality of thin-oxide MOSFETs (Ms) to create the regenerative feedback loop comprises a second thin-oxide M that turns partially on coupled to a third thin-oxide M that turns partially off that causes a fourth thin-oxide M to charge a node to turn on the output node to output the signal at the lower level voltage.

15. The method of claim 14, wherein the output node comprises a voltage output inverter.

16. The method of claim 14, wherein the pre-defined voltage is approximately 1.2 V.

17. The method of claim 14, wherein the lower level voltage is approximately 0.7 V.

18. An apparatus, comprising:

means for receiving a signal at a pre-defined voltage at an input node; and means for configuring a plurality of thin-oxide Metal Oxide-Semiconductor Field Effect Transistors (MOSFETs) coupled to the input node and an output node to form a regenerative feedback loop to reduce the signal at the pre-defined voltage to a lower level voltage, wherein the signal at the lower level voltage is outputted through the output node, wherein the plurality of thin-oxide MOSFETs (Ms) comprises a first input thin-oxide M, and wherein a drain of the first input thin-oxide M is directly coupled to the input node.

19. The apparatus of claim 18, further comprising means for providing an output voltage collapse detector, wherein, if the output voltage collapse detector receives a collapse detected signal, another thin-oxide M of the plurality of thin-oxide Ms is turned on such that any static leakage path to the output node is cut-off.

* * * * *